(12) United States Patent
Kreipl

(10) Patent No.: US 7,833,860 B2
(45) Date of Patent: Nov. 16, 2010

(54) RECESSED GATE DIELECTRIC ANTIFUSE

(75) Inventor: Dwayne Kreipl, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 677 days.

(21) Appl. No.: 11/492,620

(22) Filed: Jul. 25, 2006

(65) Prior Publication Data

US 2006/0263946 A1   Nov. 23, 2006

Related U.S. Application Data

(63) Continuation of application No. 10/933,161, filed on Sep. 2, 2004.

(51) Int. Cl.
*H01L 21/336* (2006.01)
*H01L 21/3205* (2006.01)
*H01L 21/311* (2006.01)

(52) U.S. Cl. .................. 438/259; 438/270; 438/281; 438/306; 438/589; 438/591; 438/703; 257/E23.147; 257/E21.428

(58) Field of Classification Search .......... 438/270, 438/301, 306, 430, 589, 281, 259, 591, 703; 257/E23.147, E21.428
See application file for complete search history.

(56) References Cited

U.S. PATENT DOCUMENTS

| 5,110,754 | A | | 5/1992 | Lowrey et al. |
| 5,163,180 | A | * | 11/1992 | Eltoukhy et al. ............. 257/530 |
| 5,208,177 | A | * | 5/1993 | Lee ............................. 438/239 |
| 5,429,970 | A | | 7/1995 | Hong |
| 5,550,400 | A | | 8/1996 | Takagi et al. |
| 5,567,634 | A | | 10/1996 | Hebert et al. |
| 5,661,071 | A | | 8/1997 | Chor |
| 5,693,547 | A | | 12/1997 | Gardner et al. |
| 5,937,281 | A | | 8/1999 | Wu |
| 6,069,398 | A | | 5/2000 | Kadosh et al. |
| 6,130,469 | A | * | 10/2000 | Bracchitta et al. ........... 257/530 |
| 6,346,846 | B1 | * | 2/2002 | Bertin et al. ................. 327/525 |
| 6,355,955 | B1 | | 3/2002 | Gardner et al. |
| 6,388,305 | B1 | | 5/2002 | Bertin et al. |
| 6,498,071 | B2 | | 12/2002 | Hijzen et al. |
| 6,509,624 | B1 | | 1/2003 | Radens et al. |
| 6,611,165 | B1 | | 8/2003 | Derner et al. |
| 6,700,176 | B2 | | 3/2004 | Ito et al. |

(Continued)

OTHER PUBLICATIONS

Kim et al., 3-Transistor Cell OTP ROM Array Using Standard CMOS Gate-Oxide Antifuse, Journal of Semiconductor Technology and Science, vol. 3, No. 4, Dec. 2003, pp. 205-210.

(Continued)

*Primary Examiner*—Walter L Lindsay, Jr.
*Assistant Examiner*—Ron Pompey
(74) *Attorney, Agent, or Firm*—Wells St. John P.S.

(57) ABSTRACT

A recessed dielectric antifuse device includes a substrate and laterally spaced source and drain regions formed in the substrate. A recess is formed between the source and drain regions. A gate and gate oxide are formed in the recess and lightly doped source and drain extension regions contiguous with the laterally spaced source and drain regions are optionally formed adjacent the recess. Programming of the recessed dielectric antifuse is performed by application of power to the gate and at least one of the source region and the drain region to breakdown the dielectric, which minimizes resistance between the gate and the channel.

7 Claims, 4 Drawing Sheets

U.S. PATENT DOCUMENTS

| | | | |
|---|---|---|---|
| 6,713,839 | B2 | 3/2004 | Madurawe |
| 6,724,238 | B2 | 4/2004 | Derner et al. |
| 6,740,957 | B2 | 5/2004 | Porter |
| 6,897,543 | B1 | 5/2005 | Huang et al. |
| 7,033,867 | B2 * | 4/2006 | Porter .................. 438/131 |
| 7,084,456 | B2 * | 8/2006 | Williams et al. ............ 257/329 |
| 7,211,482 | B2 | 5/2007 | Kim et al. |
| 7,238,573 | B2 * | 7/2007 | Park .................. 438/259 |
| 2002/0115257 | A1 | 8/2002 | Inagawa et al. |
| 2003/0232285 | A1 | 12/2003 | Hao et al. |
| 2005/0040462 | A1 | 2/2005 | Koh |

OTHER PUBLICATIONS

Office Action of U.S. Appl. No. 10/933,161 dated Sep. 8, 2006.
Office Action of U.S. Appl. No. 10/933,161 dated Feb. 26, 2007.
Office Action of U.S. Appl. No. 10/933,161 dated Apr. 23, 2007.
Office Action of U.S. Appl. No. 10/933,161 dated Oct. 19, 2007.
Office Action of U.S. Appl. No. 10/933,161 dated Mar. 6, 2008.
Office Action of U.S. Appl. No. 10/933,161 dated Aug. 5, 2008.
Pre-Brief Appeal Conference Decision of U.S. Appl. No. 10/933,161 dated May 12, 2009.
Office Action of U.S. Appl. No. 10/933,161 dated May 19, 2009.
McCollum, et al., "Reliability of Antifuse-Based Field Programmable Gate Arrays for Military and Aerospace Applications", Actel Corporation, Sunnyvale, CA, USA, pp. 1-6, Sep. 2001.

* cited by examiner

RECESSED GATE DIELECTRIC ANTIFUSE

CROSS REFERENCE TO RELATED APPLICATIONS

This application is a continuation of U.S. patent application Ser. No. 10/933,161, filed Sep. 2, 2004.

BACKGROUND OF THE INVENTION

The present invention relates to a semiconductor device, and more particularly, to a recessed gate dielectric antifuse.

A conventional Metal Oxide Semiconductor Field Effect Transistor (MOSFET) comprises a doped polysilicon gate, a channel conduction region, and source/drain regions formed by diffusion of dopants in the silicon substrate. The channel region separates the source from the drain in the lateral direction. A substantially planar layer of a dielectric material that prevents electrical current flow separates the polysilicon gate from the channel. The substantially planar dielectric material separating the polysilicon gate from the channel region, henceforth referred to as the gate oxide, usually consists of the thermally grown silicon dioxide ($SiO_2$) material that leaks very little current through a mechanism, which is called Fowler-Nordheim tunneling under voltage stress.

A reliable, low resistance, programmable antifuse may be formed from such a conventional MOSFET, which provides a high impedance between the gate and the source, the drain, the substrate, or a well. When the MOSFET is stressed beyond a critical electrical field by applying sufficient voltage to the gate, the transistor is destroyed by rupturing the gate oxide. In particular, the gate oxide over the substrate becomes a resistive short, causing part of the gate oxide to form current paths by diffusion of polysilicon gate material or silicon from the substrate.

To increase device yield, semiconductor integrated circuits such as EPROMs, flash EEPROMs, DRAM, SRAM, and other various random access memory types employ redundant circuitry that allows the integrated circuits to function despite the presence of one or more manufacturing or other defects by employing the redundant circuitry rather than the original, defective circuitry. Such conventional memories often use gate-oxide antifuses as part of their redundancy scheme wherein the redundant circuitry may be employed in place of defective circuitry by blowing one or more of the antifuses.

To keep pace with the current trend toward maximizing the number of circuit devices contained in a single chip, integrated circuit designers continue to design IC devices with smaller and smaller feature sizes.

SUMMARY OF THE INVENTION

It is against the above mentioned background, that the present invention provides a number of unobvious advantages and advances over the prior art. In particular, the present invention discloses a recessed dielectric antifuse device and method of formation thereof. The antifuse device includes a substrate and laterally spaced source and drain regions formed in the substrate. A recess is formed between the source and drain regions. A gate and gate oxide are formed in the recess and lightly doped source and drain extension regions contiguous with the laterally spaced source and drain regions are optionally formed adjacent the recess. Programming of the recessed dielectric antifuse is performed by application of power to the gate and at least one of the source region and the drain region to breakdown the dielectric, which minimizes resistance between the gate and the channel.

BRIEF DESCRIPTION OF THE DRAWINGS

The aforementioned features and advantages of the present invention, as well as additional features and advantages thereof, will be more clearly understood hereinafter as a result of a detailed description of the various embodiments of the invention when taken in conjunction with the following drawings, wherein like elements are indicated by like symbols.

Figure 1:
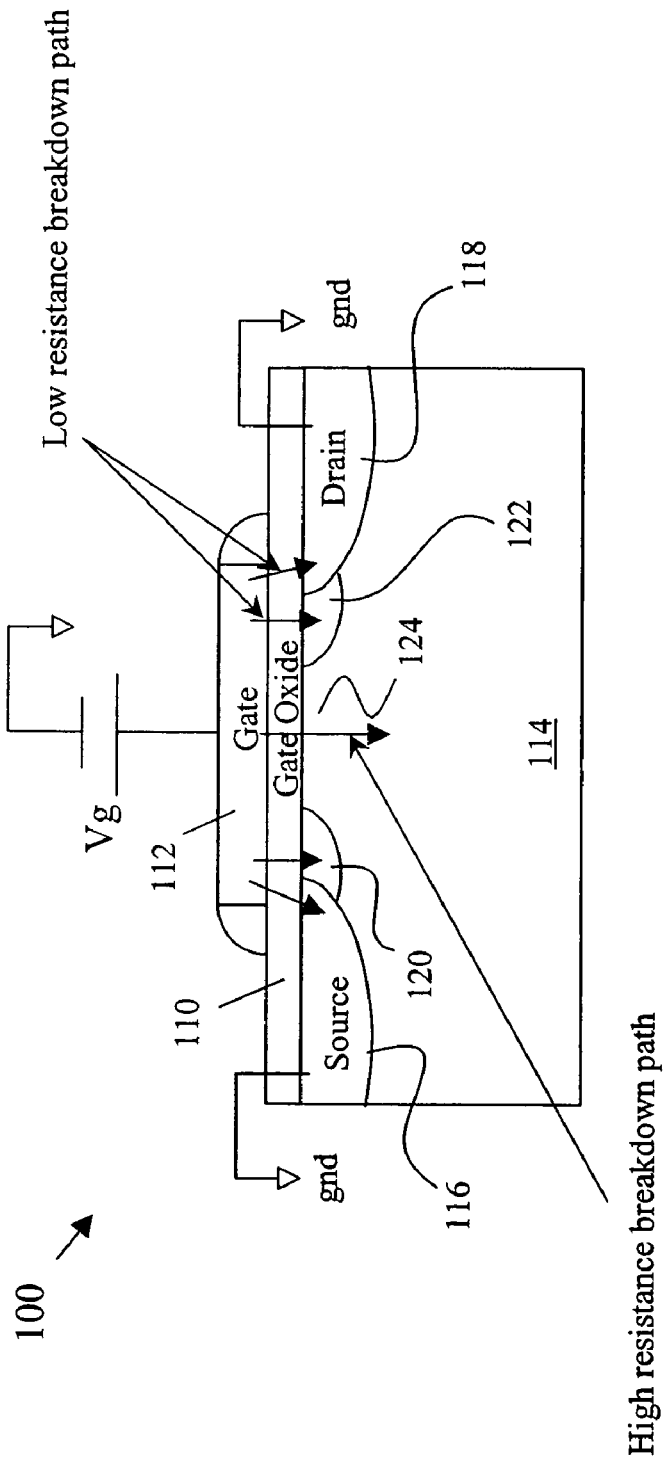
FIG. 1 is a cross-sectional diagram illustrating a conventional MOSFET antifuse device.

Skilled artisans appreciate that elements in the drawing are illustrated for simplicity and clarity and have not necessarily been drawn to scale. For example, the dimensions of some of the elements in the drawing may be exaggerated relative to other elements to help to improve understanding of the various embodiments of the present invention.

DETAILED DESCRIPTION OF THE VARIOUS EMBODIMENTS

The invention disclosed herein is directed to a recessed gate oxide antifuse and a method of fabricating the recessed gate oxide antifuse structure. The drawing figures illustrate a partially completed integrated circuit device. In the following description, numerous details are set forth in order to provide a thorough understanding of the present invention. It will be appreciated by one skilled in the art that variations of these specific details are possible while still achieving the results of the present invention.

Additionally, well-known processing steps are not described in detail in order not to unnecessarily obscure the present invention. For the sake of brevity, conventional electronics, semiconductor manufacturing, memory technologies and other functional aspects of the devices (and components of the individual operating components of the devices) may not be described in detail herein. Furthermore, for purposes of brevity, the invention is frequently described herein as pertaining to an antifuse for use in electrical or electronic systems.

It should be appreciated that many other manufacturing techniques could be used to create the antifuses described herein, and that the techniques described herein could be used as individual devices, grouped together in discrete circuits, formed in memory arrays, or integrated with other devices. Further, the techniques would be suitable for application in electrical systems, optical systems, consumer electronics, industrial electronics, wireless systems, appliances, space applications, or any other application.

The term antifuse and the terms storage or programmable coupled with the terms cell, element, or device are often used interchangeably in this field. The present invention is applicable to all these terms as they are generally understood in the relevant art.

The terms chip, integrated circuit, monolithic device, semiconductor device and microelectronic device are often used interchangeably in this field. The present invention is applicable to all of these terms as they are generally understood in the field.

The terms pins, pads and leads refer to input and/or output terminals of a connector, device, chip, printed circuit, or the like, which are used to provide electrical connection to one or more connectors, devices, chips, printed circuits, or the like. The present invention is applicable to all of these terms as they are generally understood in the field.

The terms metal line, trace, wire, conductor, signal path and signaling medium are all related. These related terms are generally interchangeable and appear in order from most specific to most general. In this field, metal lines are sometimes referred to as traces, wires, lines, interconnect or simply metal. Metal lines, generally aluminum (Al) or an alloy of Al and copper (Cu), are conductors which provide signal paths for coupling, or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), or refractory metal silicides are examples of other conductors. Signaling medium is the most general term and encompasses the others.

Moreover, it should be understood that the spatial descriptions (e.g., "above", "below", "up", "down", "top", "bottom", "beneath", "across", etc.) made herein are for purposes of illustration only, and that practical antifuses can be spatially arranged in any orientation or manner. Arrays of these antifuses can also be formed by connecting them in appropriate ways and with appropriate devices.

As discussed below, the following sections more fully describe the present invention.

A cross-sectional view of a conventional MOSFET device 100 is shown in FIG. 1 to illustrated the differences of the present invention from the prior art. MOSFET 100 comprises a a gate dielectric 110 overlaid with a gate 112 and formed on a substrate 114. The gate 112 is typically formed of polysilicon, and the gate dielectric 110 is typically a gate oxide, such as for example, silicon dioxide, silicon nitride, or the like.

Within the substrate 114 are formed heavily doped source and drain regions 116 and 118, and lightly-doped source and drain extension regions 120 and 122, respectively. Generally, doped regions are regions containing a higher concentration of p-type or n-type dopants than the rest of the substrate 114. The source and drain extension regions 120 and 122 generally have a lower concentration of dopants compared to the source and drain regions 116 and 118. However, the regions 116, 118, 120 and 122 can be doped to the same levels. The region in the substrate directly below the gate 112, and between source and drain extension regions 120 and 122, is typically referred to as a channel region 124.

Resistive current paths can be formed between the gate 112, the channel region 124, or the source and drain extension regions 120 and 122. The lowest resistance paths tend to be between the gate 112 and the source or drain regions 116 and 118 and the source or drain extension regions 120 and 122. However, when the resistive current paths are formed from the gate electrode 112 to the substrate 114, which can comprise a P-well or N-well, the fuse resistance is much higher. It is known by those having ordinary skilled in the art that soft breakdown (i.e., high fuse resistance) and hard breakdown (i.e., low fuse resistance) are influenced by a breakdown spot position. The soft breakdowns almost exclusively occur between the gate 112 and channel region 124 (i.e., substrate, N-well, or P-well).

Both high resistance and low resistance breakdown paths are illustrated in FIG. 1. Breakdown of the gate dielectric 110 is caused by application of a voltage (Vg) to gate 112, while source 116 and drain 118 are grounded. Generally, programming and sensing of antifuse devices, and the associated circuits to perform these operations, are well known to persons having ordinary skill in the art. Metal lines, polysilicon doped regions, or the like, are used to couple the drain and source regions to ground for programming, or to a sense circuit for determining the state of the antifuse.

For antifuse applications, the soft breakdowns are undesirable because fuse resistance distribution is considerably higher than that of the hard breakdown. Also, the fuse resistance of the conventional MOSFET antifuse device initially decreases in channel length, but begins to increase with a further decrease in channel length for a given power supply applied to the antifuse. Furthermore, the variability of the fuse resistance increases with a decrease in channel length. In particular technologies, in order to achieve a high density memory cell, the fuse structure should be as small as possible. Thus, conventional MOSFET antifuse devices are not suitable to provide for a small redundancy or error correction structure of a high density memory cell due to variability of the fuse resistance and increase in fuse resistance.

The present invention is directed to a device and associated manufacturing method that overcome these above-noted deficiencies in conventional MOSFET antifuses.

Figure 2:
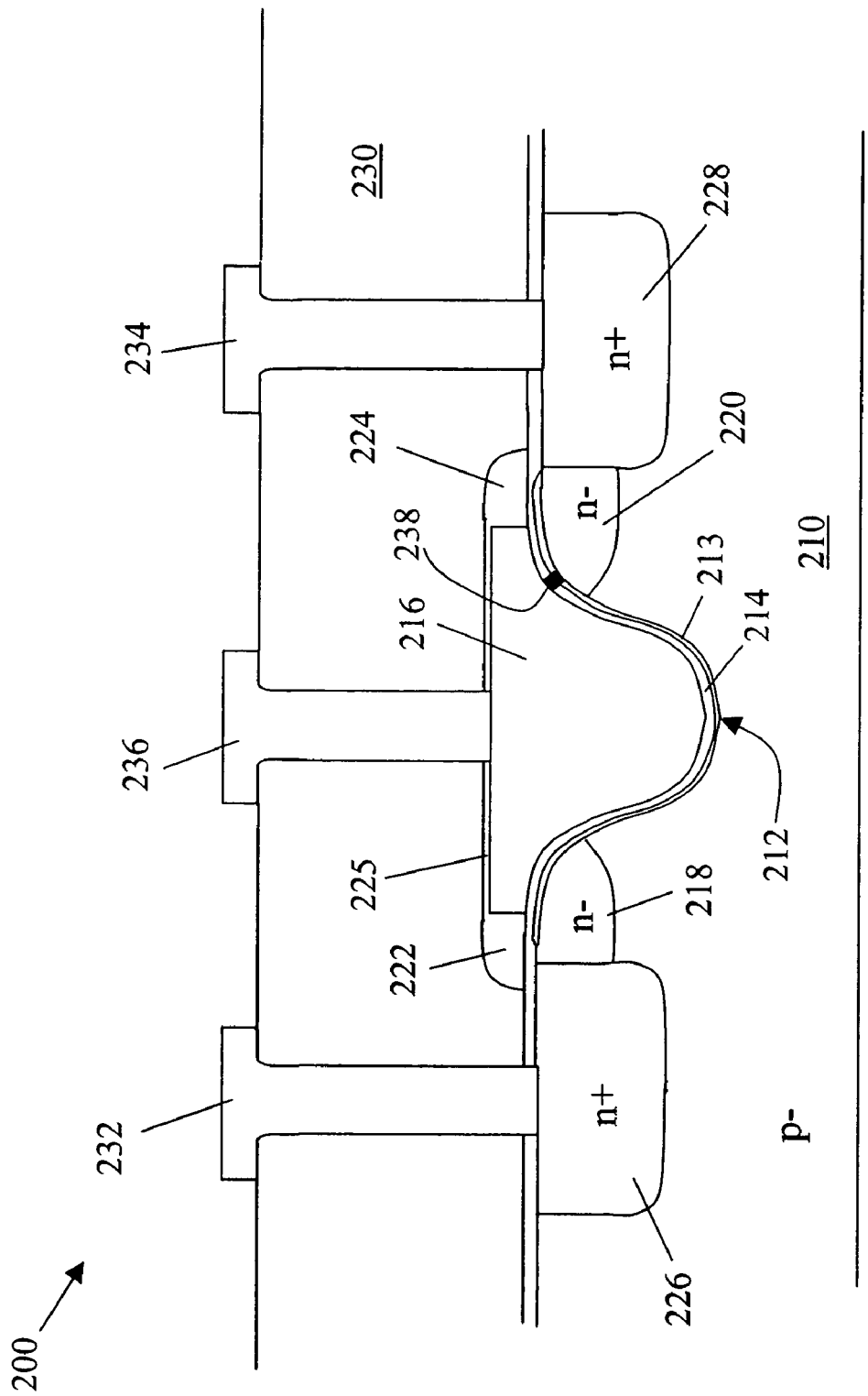
FIGS. 2 and 3 schematically illustrate the cross sectional view of various embodiments of an antifuse structure according to the present invention.

FIG. 2 illustrates a cross-section of a MOSFET antifuse device 200 according to an embodiment of the present invention. Antifuse 200 is fabricated on a silicon substrate 210 of a first conductivity type. The substrate 210 can be any semiconductor material, including, for example, gallium arsenide (GaAs), silicon (Si), strained silicon, germanium (Ge), silicon-germanium (SiGe), silicon-on-insulator (SOI), silicon-on-sapphire (SOS), doped and undoped semiconductors, epitaxial layers of silicon supported by a base semiconductor foundation, and other semiconductor structures. In the illustrated embodiment, the substrate is P-type silicon having a resistivity of from about 1 to 100 ohms/cm.

After defining shallow trench isolation (STI) regions, the substrate 210 is patterned to form recess regions in the active areas, such as for example, a recess 212 formed in the substrate 210. Width of the recess 212 is about 0.5 times the wordline width. Depth of recess 212 is adjusted to optimize electrical characteristics of the access device. Next a sacrificial oxide/wet etch oxide 213 for surface smoothing is grown in the recess 212. This sacrificial oxidation is optimized to minimize a thickness delta between the bottom and the sidewall of the recess 212.

A gate dielectric layer 214 is formed over the surface of substrate 210, lining the recess 212, using conventional semiconductor processing techniques, thereby forming a recessed gate dielectric. In one embodiment, the gate dielectric layer 214 is an oxide, such as for example, silicon dioxide, and has a thickness of between about 20 and about 50 angstroms. In one embodiment, the gate oxide 214 is grown with the oxidation again being optimized to minimize a thickness delta between the bottom and the sidewall of the recess 212. The gate oxide 214 is then patterned (e.g., photo/etch) as needed to define thin/thick oxide regions.

The present invention, however, is not limited to antifuses having oxide dielectrics. Those of ordinary skill in the art will be able to substitute other known antifuse dielectric materials into the antifuse structure disclosed herein. For example, in other embodiments, amorphous silicon, silicon nitride, ONO, tantalum oxide ($Ta_2O_5$), BST, PZT, lanthanide materials, and combinations thereof may be a suitable dielectric. Additionally, the dielectric thickness will, in part, determine the voltage at which programming of the antifuse element will be achieved. Proper selection of the thickness will assure both unprogrammed antifuse integrity and that the program voltage will be low enough such that an integrated circuit process can be used to build an array using the antifuse element.

An optional second gate oxidation may be performed to provide a desired gate oxide 214 thickness for access and periphery thick oxide devices. Once again, the second gate oxidation is optimized to minimize thickness delta between bottom of recess and sidewall of recess.

Next, a gate 216 is formed on the surface of dielectric layer 214, where by the thickness of the deposition completely fills the recess 212. The gate 216 is doped, in-situ or via implantation, to provide poly dopants (n+poly, p+poly), a desired threshold voltage, sheet resistance, and the like. In one embodiment, gate 216 is an amorphous silicon having a thickness of about between 1,500 and 3,000 angstroms, and doped to a sheet resistance of about 30 ohms/square. The gate 216 is defined using conventional processing techniques where by the remaining exposed gate oxide may be removed using standard semiconductor etching techniques. In other embodiments, the gate 216 may be metal, silicon, polysilicon, polycide, silicide, and combinations thereof. Rapid thermal processing (RTP) is then performed to active the poly dopants.

After gate 216 is defined, optionally, first and second lightly doped extension regions 218 and 220 of a second conductivity type are formed in substrate 210 using the well-known self-aligned gate process. In one embodiment, the first and second regions 218 and 220 are lightly doped source and drain (LDD) regions formed in the substrate 210 adjacent the channel region. In the illustrated embodiment, the lightly doped drain (LDD) are n− regions formed by implanting ions, selected from phosphorus, arsenic, and antimony ions, at energies within ranges that are conventional in the art to achieve a selected source and drain impurity ion amount. Typically, ions are implanted with dosages of from between about $1 \times 10^{13}$ to about $1 \times 10^{14}$ atoms/cm$^2$ at energies of between about 5 to 80 KeV at a vertical angle to provide an average dopant concentration for the LDD regions ranging from about $1 \times 10^{17}$ ions/cm$^3$ to $1 \times 10^{19}$ ions/cm$^3$. For LDD p− regions, boron, boron bifluoride (BF$_2$), or borane (B$_2$H$_{10}$) ions are used with the same dosages and energies, and resulting in the same concentrations as mentioned above.

Spacers 222 and 224 are then formed on the sidewalls of gate 216 and in one embodiment, are formed by providing a layer of CVD SiO$_2$ and etching it back, leaving spacers 222 and 224. In other embodiments, the spaces 222 and 224 may be silicon nitride, or any other suitable spacer material. The spacers 222 and 224 may have a base width from about 100 to about 500 Angstrom. In another embodiment, an insulating capping layer 225, integral with spacers 222 and 224 may formed and having a thickness of between from about 100 to about 200 Angstroms. The capping layer 225 may be the same material as the spacers 222 and 224, or any other suitable insulating material.

Third and fourth regions 226 and 228 of the second conductivity type are then formed in the silicon substrate 210 using known methods. In one embodiment, regions 226 and 228 are heavily doped source and drain (HDD) regions formed by the ion implantation of n+ ions. Ions selected from phosphorus, arsenic, antimony ions and the like are implanted at energies within ranges that are conventional in the art to achieve a selected source and drain impurity ion amount. Typically, n+ ions are implanted at dosages of between about $1 \times 10^{14}$ to about $8 \times 10^{15}$ atoms/cm$^2$, and at energies of between about 5 to about 80 KeV at a vertical angle to provide an average dopant concentration for the diffusion regions ranging from about $1 \times 10^{17}$ ions/cm$^3$ to $1 \times 10^{19}$ ions/cm$^3$. For HDD p+ regions, boron, boron bifluoride (BF$_2$), or borane (B$_2$H$_{10}$) ions are used with the same dosages and energies, and resulting in the same concentrations as mentioned above. Regions 226 and 228 are self aligned to the edges of spacers 222 and 224. Regions 226 and 228 are so located that region 226 is contiguous with region 218 and region 228 is contiguous with region 220.

Next, an insulating region 230 may be formed. Contact holes are then etched in insulating region 230 and contacts 232 and 234 are formed to regions 226 and 228 and contact 236 is formed to gate 216. Contacts 232, 234 and 236 are used to form electrical connections to a metal layer for connection to other circuitry in the integrated circuit as is well known in the art. In one embodiments, the contacts 232, 234, and 236 may be a metal, titanium tungsten (TiW), polysilicon, and combination thereof.

Before programming, antifuse 200 is an open circuit, the resistance between gate 216 and the regions 218, 220, 226, and 228 in the silicon substrate 210 being higher than $1 \times 10^9$ ohms. A low resistance filament 238 may be formed between regions 220 and/or 228 and the gate 216 by applying a programming voltage in the range of 6-8 volts on region 228 with respect to the substrate, with region 226 held at the substrate potential while the gate 216 is grounded or biased at a slightly positive voltage, i.e., a voltage in the approximate range of 0-2 volts, with respect to the substrate. All voltages are measured with respect to the substrate.

Under these conditions, the device will be brought into snap-back breakdown. Snap-back breakdown is a well known phenomenon, characterized in the structure of FIG. 2 by turning on the parasitic NPN bipolar transistor having regions 218 and 226 as its emitter, substrate 210 as its base, and regions 220 and 228 as its collector. Snap-back breakdown is further characterized by a rise in the current flowing into regions 220 and 228 and by a high-electric-field existing at or near the junction between regions 220 and 228 and substrate 210. The combination of high current density and high electric field results in the generation of holes through avalanche-impact ionization and subsequent acceleration of these holes. Some of the energetic holes (or hot holes as they are commonly called) are injected into the dielectric 214. It is known that hole injection into a dielectric, such as SiO$_2$, causes or accelerates the dielectric breakdown process.

Under the snap-back breakdown condition, dielectric 214 in the antifuse 200 can be broken down in milliseconds or a shorter time. After breakdown, contact 236 will be electrically connected to contact 234 through gate 216, with an ohmic connection through the rupture in dielectric 214 located over regions 220 and/or 228. Thus, the antifuse is programmed.

It is to be appreciated that regions 218 and 220 are optional. Accordingly, if the structure disclosed with respect to FIG. 2 did not include lightly doped regions 218 and 220, rupture of gate dielectric 214 would tend to short contact 236 and gate 216 to not only region 228 but also to substrate 210 because the high electric field would be located at the metallurgical junction between the substrate 210 and the heavily-doped drain 228. Since substrate 210 is held at ground, no useful electric signal could be passed from contact 234, through gate 216 and region 228, to contact 236. The antifuse in FIG. 2 is immune to this problem. Depending on the LDD dose, the high electric field can be moved inside the n− region, thus preventing breakdown to substrate 210 and guaranteeing breakdown into the doped region in the substrate. Other known techniques for fabricating the n– region of an LDD structure, including those not using spacers 222 and 224, may of course be employed.

Figure 3:
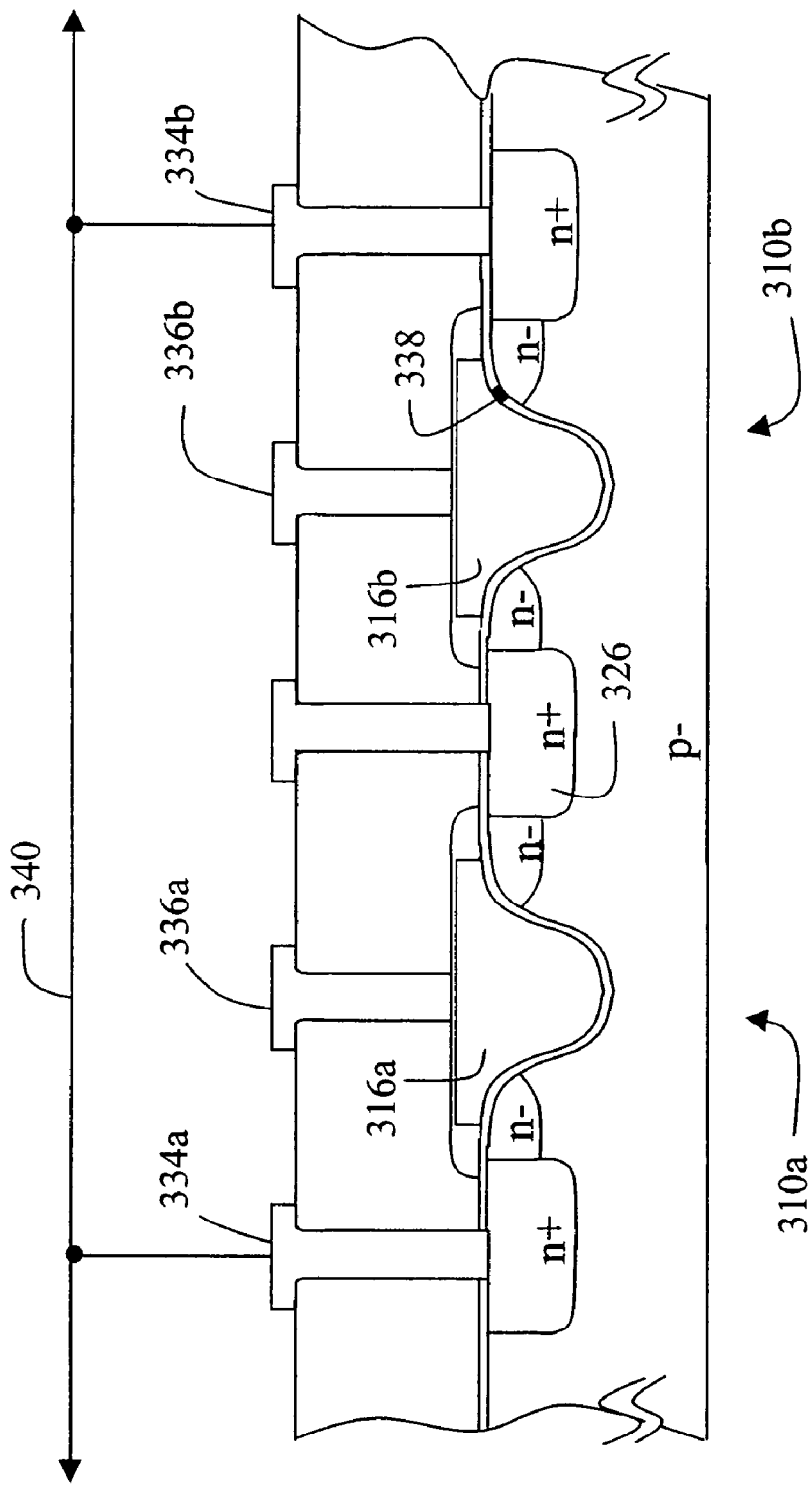

Referring now to FIG. 3, a cross sectional diagram of an array of antifuses of FIG. 2 is shown. FIG. 3 is illustrative only and depicts a single row of an array having two antifuses. Those of ordinary skill in the art will readily realize that actual arrays fabricated according to the present invention may have an arbitrary number of rows.

Field oxide regions separate the pair of antifuses 310a and 310b from other antifuse pairs on the same row as is conventionally employed in integrated circuit layout design. Antifuses 310a and 310b share a common source 326 and are each identical to the antifuse described with reference to FIG. 2, and the description thereof will not be repeated in order to avoid a repetitious disclosure. Contact 336a to polysilicon gate 316a and its associated metal line, shown in cross section, form a first column line for the array and contact 336b to polysilicon gate 316b and its associated metal line, shown in cross section, form a second column line for the array. Contacts 334a and 334b are connected together to a row line, shown schematically as a wire 340.

As shown in FIG. 3, only antifuse 310b has been programmed and contains a conductive filament 338. Antifuse 310b remains unprogrammed.

Figure 4:
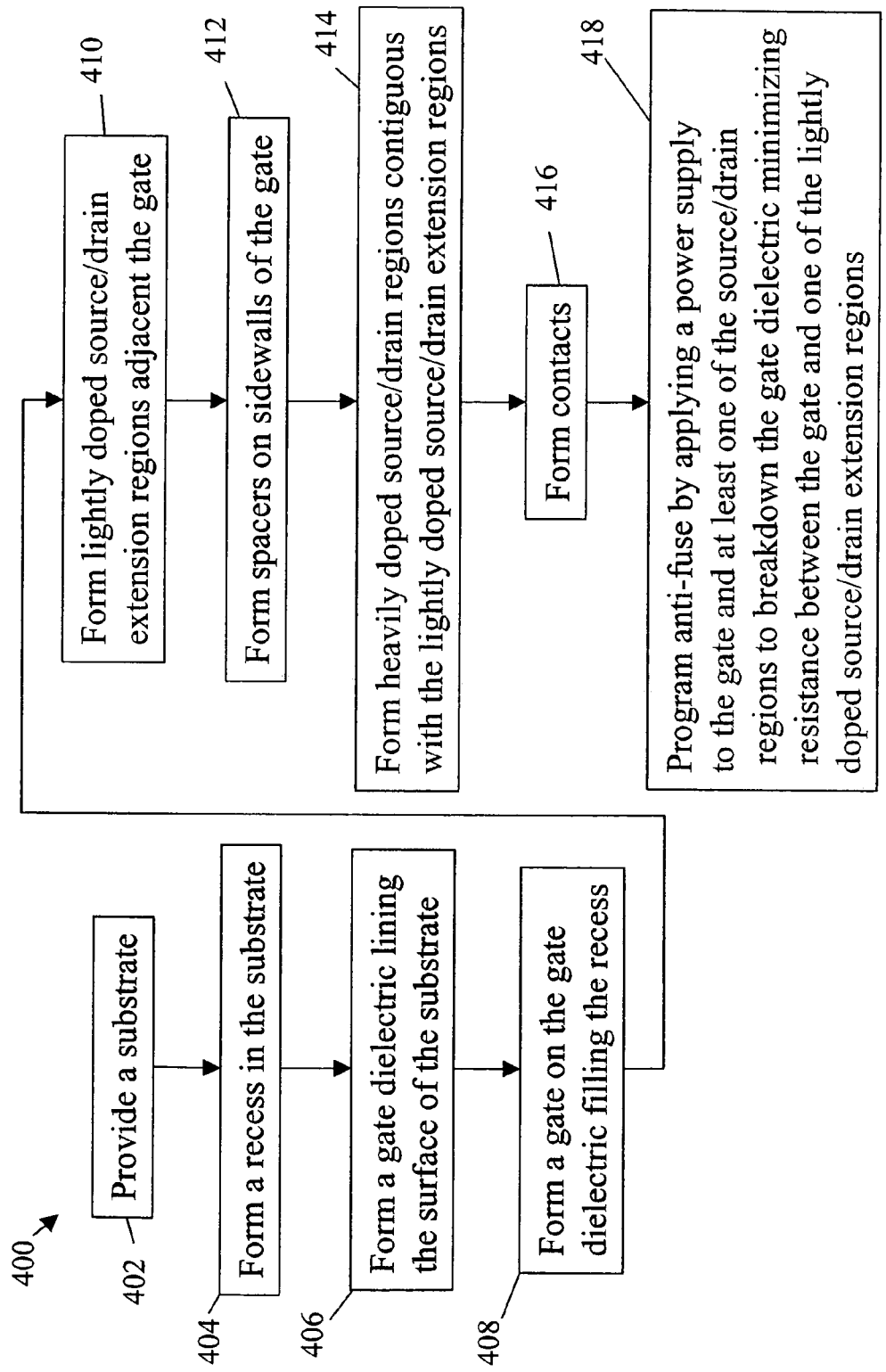
FIG. 4 is a flowchart illustrating a method to reduce on-state resistance and improving current characteristics of the MOSFET antifuse device, in according to embodiments of the present invention.

FIG. 4 illustrates a flow chart showing a method 400 for reducing on-state resistance and improving current characteristics of an antifuse device, according to embodiments of the present invention. At step 402, a substrate is provided, which can be a lightly doped substrate. At step 404, a recess having a predetermined geometry (depth and lateral extensions) is formed in the substrate, and at step 406, the recess is lined with a gate dielectric, forming a recessed gate dielectric. At step 408, a gate is formed on the recessed gate dielectric filling the recess. At step 410, laterally spaced lightly doped source and drain extension regions are optionally formed adjacent the gate. At step 412, spacers are formed on sidewalls of the gate, and if provided overlying the lightly doped source and drain extension regions. At step 414, heavily doped source and drain regions are formed, which are contiguous with the laterally spaced lightly doped source and drain extension regions, if provided. At step 416, contacts are formed. At step 418, the antifuse device is programmed.

As illustrated by FIG. 2, the gate dielectric 214 and gate 216 are non-planar or curvilinear, as opposed to planar or linear as illustrated by FIG. 1. Accordingly, a recessed channel is defined between the source and drain regions, which has a longer length in a smaller area than conventional planar gates.

An advantage of the present invention is the compact nature of nonvolatile one-time programming antifuse devices, which can be manufactured using standard 0.13 μm or other CMOS processes. Additionally, the present invention with its recessed gate dielectric arrangement, provides in one embodiment about a 20 percent reduction in gate oxide thickness, and about a 25 percent reduction in gate thickness as compared to conventional gate-oxide antifuses. Furthermore, the present invention provide a longer gate length in a smaller horizontal area, such that programming can use a lower voltage than the conventional programming voltages of 10 to 12 volts used to rupture the gate oxide. Moreover, the antifuse devices of the present invention minimize resistance variances between blown antifuse devices and are optimized with small chip area utilization. Thus, integrating multitudes of antifuses on a single IC can be achieved according to the present invention.

The present invention can be implemented with various changes and substitutions to the illustrated embodiments. For example, the present invention can be useful in programmable application-specific integrated circuits (ASICs), such as programmable logic devices (PLDs) and field-programmable gate arrays (FPGAs).

The above described embodiments are intended to illustrate the principles of the invention, not to limit its scope. Other embodiments in variations to these preferred embodiments will be apparent to those skilled in the art and may be made without departing from the spirit and scope of the invention as defined in the following claims.

What is claimed is:

1. A method of forming and programming an antifuse structure, comprising:

forming a recess extending into semiconductor material of a semiconductor substrate, the recess having a curvilinear bottom periphery; the semiconductor substrate having an uppermost surface, and after the recess is formed a first region of the uppermost surface being within the recess, and a second region of the uppermost surface being outside of the recess and elevationally above the first region of the uppermost surface; the recess having a width, and having opposing lateral edges on either side of said width;

forming a first dielectric layer within the recess along the curvilinear bottom periphery, the first dielectric layer extending across an entirety of the first region of the uppermost surface of the semiconductor substrate, and across a portion of the second region of the uppermost surface of the semiconductor substrate; the first dielectric layer having outer peripheral edges over the second region of the uppermost surface of the semiconductor substrate;

forming a second dielectric layer over the first dielectric layer, the second dielectric layer extending across an entirety of the first region of the uppermost surface of the semiconductor substrate, and across more of the second region of the uppermost surface of the semiconductor substrate than the first dielectric layer so that the second dielectric layer extends laterally outward of the first dielectric layer;

forming electrically conductive gate material over the first and second dielectric layers and within the recess to fill the recess; the electrically conductive gate material being patterned to form a gate having a pair of opposing sidewalls; said sidewalls being over the second region of said uppermost surface;

forming sidewall spacers along the gate sidewalls, the sidewall spacers covering the outer peripheral edges of the first dielectric layer;

forming heavily doped source/drain regions extending into the semiconductor material of the semiconductor substrate; said heavily doped source/drain regions being laterally outward of the sidewall spacers;

forming lightly doped source/drain regions under the sidewall spacers; and generating a voltage differential between the gate and one of the source/drain regions; the voltage differential creating snap-back breakdown to form a rupture through the dielectric layer, and the voltage differential being sufficient to form an electrically conductive filament within the rupture, the filament ohmically connecting the gate to one of the lightly doped source/drain regions.

2. The method of claim 1 wherein the heavily doped source/drain regions are majority n-type doped.

3. The method of claim 1 wherein the heavily doped source/drain regions are majority p-type doped.

4. The method of claim 1 wherein the semiconductor substrate comprises silicon, and wherein the recess extends into the silicon of the semiconductor substrate.

5. A method of forming and programming an antifuse structure, comprising:
- forming a recess extending into semiconductor material of a semiconductor substrate, the recess having a curvilinear bottom periphery; the semiconductor substrate having an uppermost surface, and after the recess is formed a first region of the uppermost surface being within the recess, and a second region of the uppermost surface being outside of the recess and elevationally above the first region of the uppermost surface; the recess having a width, and having opposing lateral edges on either side of said width;
- oxidizing the first region of said uppermost surface to line the recess with a first dielectric layer, the first dielectric layer being entirely along the first region of said uppermost surface, and only partially along the second region of said uppermost surface; the first dielectric layer along the second region of said uppermost surface extending to first lateral distances beyond the lateral edges of the recess;
- forming a second dielectric layer over the first dielectric layer, the second dielectric layer being entirely along the first and second regions of the semiconductor substrate; the first and second dielectric layers within the recess together forming a recess lining along the curvilinear bottom periphery;
- forming electrically conductive gate material over the recess lining and within the recess to fill the recess; the electrically conductive gate material being patterned to form a gate having a pair of opposing sidewalls; said sidewalls being over the second region of said uppermost surface;
- forming sidewall spacers along the gate sidewalls, the sidewall spacers extending laterally outward beyond the first lateral distances of the first dielectric layer;
- forming heavily doped source/drain regions extending into the semiconductor material of the semiconductor substrate; said heavily doped source/drain regions being laterally outward of the sidewall spacers, and being laterally outward of the first lateral distances of the first dielectric layer;
- forming lightly doped source/drain regions under the sidewall spacers, and under both of the first and second dielectric layers; and
- generating a voltage differential between the gate and one of the source/drain regions; the voltage differential creating snap-back breakdown to form a rupture through the recess liner, and the voltage differential being sufficient to form an electrically conductive filament within the rupture, the filament ohmically connecting the gate to one of the lightly doped source/drain regions.

6. The method of claim 5 wherein said voltage differential is from 6 volts to 8 volts.

7. The method of claim 5 wherein the second dielectric layer comprises tantalum oxide.

* * * * *